(12) United States Patent
Lim et al.

(10) Patent No.: US 9,576,865 B2
(45) Date of Patent: Feb. 21, 2017

(54) FILM FOR SEMICONDUCTOR PACKAGE, SEMICONDUCTOR PACKAGE USING FILM AND DISPLAY DEVICE INCLUDING THE SAME

(71) Applicant: Samsung Electronics Co., Ltd., Suwon-si, Gyeonggi-do (KR)

(72) Inventors: Soyoung Lim, Hwaseong-si (KR); JaeMin Jung, Seoul (KR); Jeong-Kyu Ha, Hwaseong-si (KR); Donghan Kim, Osan-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/964,523

(22) Filed: Dec. 9, 2015

(65) Prior Publication Data

US 2016/0197020 A1    Jul. 7, 2016

(30) Foreign Application Priority Data

Jan. 2, 2015    (KR) .................. 10-2015-0000066

(51) Int. Cl.
*H01L 23/58* (2006.01)
*H01L 21/66* (2006.01)
*H01L 23/00* (2006.01)
*H01L 23/498* (2006.01)

(52) U.S. Cl.
CPC .......... *H01L 22/32* (2013.01); *H01L 23/4985* (2013.01); *H01L 23/49827* (2013.01); *H01L 23/49838* (2013.01); *H01L 24/09* (2013.01); *H01L 23/49811* (2013.01); *H01L 2224/0912* (2013.01)

(58) Field of Classification Search
CPC .............. H01L 22/32; H01L 23/49811; H01L 23/49827; H01L 23/49838; H01L 24/09; H01L 2224/0912
USPC ........................................... 257/48
See application file for complete search history.

(56) References Cited

U.S. PATENT DOCUMENTS

| | | |
|---|---|---|
| 7,217,990 B2 | 5/2007 | Chung |
| 7,282,801 B2 | 10/2007 | Park et al. |
| 7,442,968 B2 | 10/2008 | Kim et al. |
| 7,652,366 B2 | 1/2010 | Chung et al. |
| 8,384,407 B2 | 2/2013 | Lim et al. |
| 8,709,832 B2 | 4/2014 | Kim et al. |
| 8,853,694 B2 | 10/2014 | Han et al. |
| 2002/0139567 A1 | 10/2002 | Kim et al. |
| 2004/0245628 A1 | 12/2004 | Chung |
| 2006/0055037 A1 | 3/2006 | Park et al. |
| 2008/0303148 A1 | 12/2008 | Chung et al. |
| 2009/0322362 A1 | 12/2009 | Lim et al. |
| 2010/0295045 A1 | 11/2010 | Yoshino |

(Continued)

FOREIGN PATENT DOCUMENTS

| | | |
|---|---|---|
| JP | 2008244069 A | 10/2008 |
| KR | 20040065440 A | 7/2004 |
| KR | 1020060128168 A | 12/2006 |

*Primary Examiner* — Tu-tu Ho
(74) *Attorney, Agent, or Firm* — Renaissance IP Law Group LLP

(57) ABSTRACT

A semiconductor package may include a first output test pad and a second output test pad disposed on a first surface of an insulating film, and a semiconductor chip disposed between the first output test pad and the second output test pad on a second surface opposing to the first surface of the insulating film.

20 Claims, 11 Drawing Sheets

(56) References Cited

U.S. PATENT DOCUMENTS

2012/0061669 A1 3/2012 Kim et al.
2012/0248439 A1* 10/2012 Lee .................. H01L 23/49838
                                                        257/48
2013/0175528 A1 7/2013 Han et al.

* cited by examiner

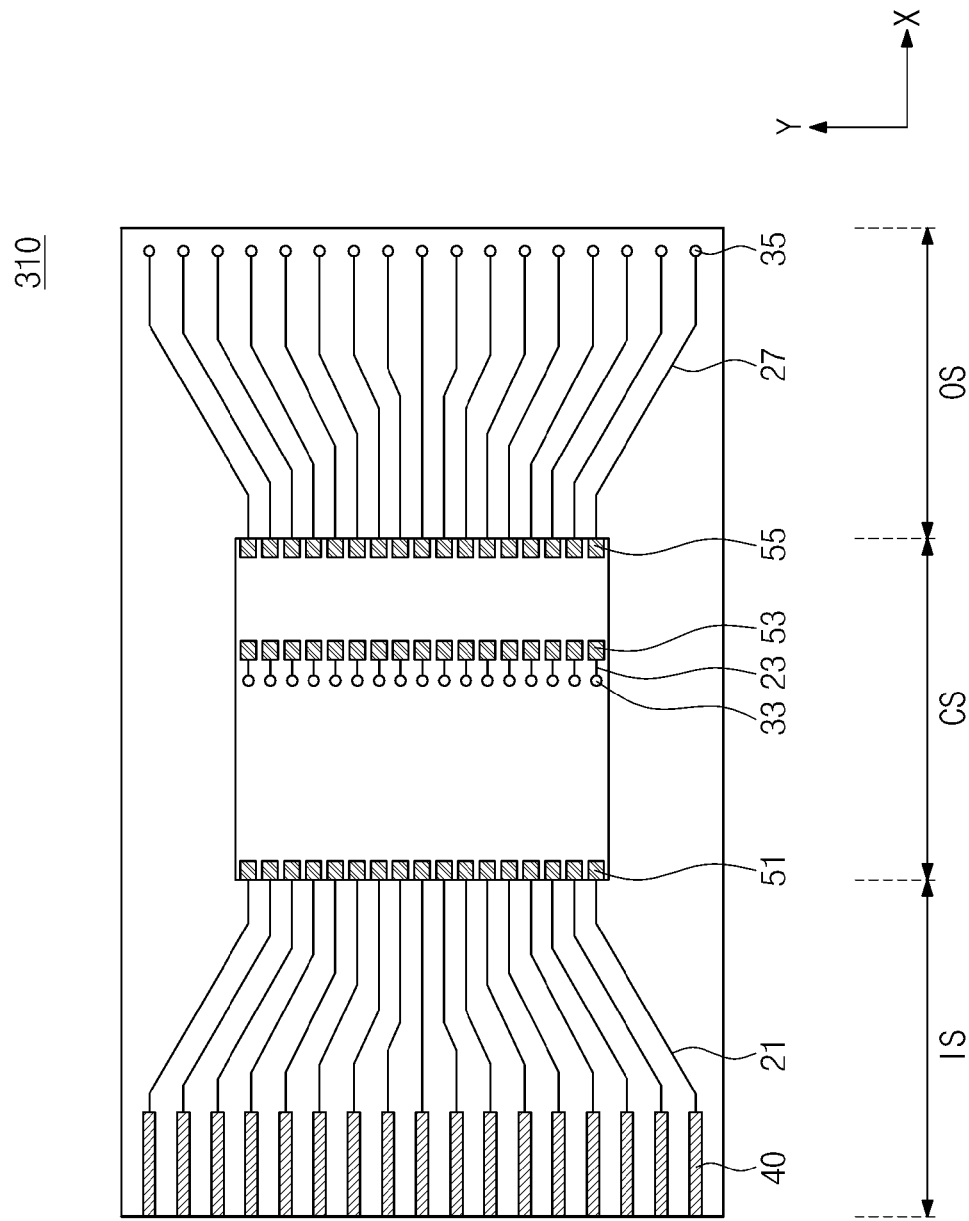

2000

3000

4000

5000

FILM FOR SEMICONDUCTOR PACKAGE, SEMICONDUCTOR PACKAGE USING FILM AND DISPLAY DEVICE INCLUDING THE SAME

CROSS-REFERENCE TO RELATED APPLICATION

This U.S. non-provisional patent application claims priority under 35 U.S.C. §119 to Korean Patent Application No. 10-2015-0000066, filed on Jan. 2, 2015, in the Korean Intellectual Property Office, the disclosure of which is hereby incorporated by reference in its entirety.

BACKGROUND

The inventive concepts relate to a semiconductor package and a display device including the same. More particularly, the inventive concepts relate to a chip-on-film (COF) package and a display device including the same.

Tape film packages have been developed as a high-density semiconductor chip mounting technique to realize small, thin and light electronic products. The tape film packages may include a tape carrier package and a chip-on-film (COF) package. The COF package may include a semiconductor die bonded directly to a substrate by a flip-chip bonding technique and may be connected to an external system through short leads. In addition, since dense interconnection patterns may be formed in COF package, the COF package may be attractive as a high-integration package technique.

The COF package may be used in portable devices (e.g., a cellular phone or a personal digital assistant (PDA)) and a laptop computer). For example, the COF package may electrically connect a printed circuit board (PCB) to a display panel of the portable device. The display panel may be driven by a semiconductor chip that performs various functions and has a lot of input and output terminals. In particular, the number of the output terminals may be more than that of the input terminals in order to transmit a lot of signals from the semiconductor chip to the display panel. Meanwhile, signal transmission characteristics of the input and output terminals may be tested through test pads connected to the input and output terminals.

SUMMARY

Example embodiments of the inventive concepts may provide a semiconductor package including a plurality of output and input pads.

Example embodiments of the inventive concepts may also provide a display device including a chip-on-film package.

In accordance with example embodiments of the inventive concepts, a semiconductor package may include: a first output test pad and a second output test pad disposed on a first surface of an insulating film, and a semiconductor chip disposed between the first output test pad and the second output test pad on a second surface opposing to the first surface of the insulating film. In some example embodiments, the semiconductor package may further include a first output via and a second output via penetrating the insulating film and disposed between the first and second output test pads, a first pad and a second pad disposed between the second surface of the insulating film and the semiconductor chip, wherein the first output via electrically connects the first output test pad and the first pad with each other, and wherein the second output via electrically connects the second output test pad and the second pad with each other.

In some example embodiments, the semiconductor package may further include a first output pad disposed adjacent to the second output test pad on the first surface of the insulating film and connected with the first output test pad, and a second output pad disposed between the first output pad and the second output test pad on the first surface of the insulating film, and contacts with the second output test pad.

In some example embodiments, the semiconductor package may further include a first output lead disposed between the first output test pad and the first output pad on the first surface of the insulating film to establish a connection therebetween, and a second output lead disposed on the second surface of the insulating film, and connects the second output via and the second pad with each other.

In some example embodiments, the semiconductor package may further include an input test pad disposed beside the first output test pad to be adjacent to an edge portion of the insulating film on the first surface of the insulating film, an input pad disposed between the first output test pad and the semiconductor chip on the second surface of the insulating film, an input via penetrating the insulating film to connect the input test pad and the input pad with each other, and disposed between the first output test pad and the input test pad, and a third pad disposed between the second surface of the insulating film and the semiconductor chip, and connected with the input pad.

In some example embodiments, the first pad is disposed between the second pad and the third pad, the second pad is disposed adjacent to the second output test pad, and the third pad is disposed adjacent to the input test pad.

In some example embodiments, the input pad is extended toward the input test pad to contact with the input via.

In accordance with example embodiments of the inventive concepts, a display device may include: a package substrate including a first surface and a second surface opposing to the first surface, and a semiconductor chip disposed on the second surface of the package substrate. The package substrate comprises: a first output pad disposed on the first surface of the package substrate, a second output pad disposed between the first output pad and the semiconductor chip on the first surface of the package substrate, a first output via penetrating the package substrate, and connecting the first output pad and the semiconductor chip with each other, and a second output via penetrating the package substrate, and connecting the second output pad and the semiconductor chip with each other.

In some example embodiments, the display device may further include a first output lower lead disposed on the second surface of the package substrate, and connects the semiconductor chip and the first output via with each other, a second output lower lead disposed spaced apart from the first output lower lead on the second surface of the semiconductor substrate, and connects the semiconductor chip and the second output via with each other, and an output upper lead disposed between the second output pad and the second output via on the first surface of the semiconductor substrate to establish a connection therebetween.

In some example embodiments, the output upper lead is extended crossing the second output via, one edge portion of the output upper lead is exposed at one sidewall of the package substrate.

In some example embodiments, the display device may further include an input pad disposed on the second surface of the semiconductor substrate and faces to the second output pad with the semiconductor chip as the center in the diagonal direction, and an input lead disposed between the input pad and the semiconductor chip on the second surface of the semiconductor substrate to establish a connection therebetween.

In some example embodiments, one sidewall of the input pad is coplanar with one sidewall of the package substrate.

In some example embodiments, the display device may further include a circuit board disposed on the input pad, and a panel disposed on the first output pad and the second output pad.

In some example embodiments, the first output via is disposed below the first output pad to contact the first output pad, the second output via is disposed below the semiconductor chip.

In some example embodiments, one sidewall of the first output pad is coplanar with one sidewall of the package substrate.

In accordance with example embodiments of the inventive concepts, A film for a package substrate may include: a first test pad, a second test pad and a third test pad disposed on one surface of insulating film, the third test pad is disposed between the first test pad and the second test pad and is adjacent to the first test pad, a first in/output pad and a second in/output pad disposed between the second pad and the third test pad on the one surface of the insulating film, the first in/output pad is connected with the second test pad, and the second in/output pad is connected with the third test pad, a third in/output pad disposed between the third test pad and the second in/output test pad on other surface opposing to the one surface of the insulating film, and connected with the first test pad through a first via penetrating the insulating film, and a chip pad disposed between the second in/output pad and the third in/output pad on the other surface of the insulating film.

In some example embodiments, the first in/output pad contacts with the second test pad.

In some example embodiments, the second in/output pad is disposed more adjacent to the first in/output pad than the third test pad.

In some example embodiments, the film for the package substrate may further include a second via penetrating the insulating film, and connected with the first in/output pad, and a third via penetrating the insulating film to be connected with second in/output pad, and disposed between the first via and the second via.

In some example embodiments, the third in/output pad is extended toward the first test pad to contact with the first via.

BRIEF DESCRIPTION OF THE DRAWINGS

The inventive concepts will become more apparent in view of the attached drawings and accompanying detailed description.

FIG. 6A is a bottom view of the display device of FIGS. 4 and 5 according to example embodiments of the inventive concepts;

DETAILED DESCRIPTION OF THE EMBODIMENTS

Figure 1:
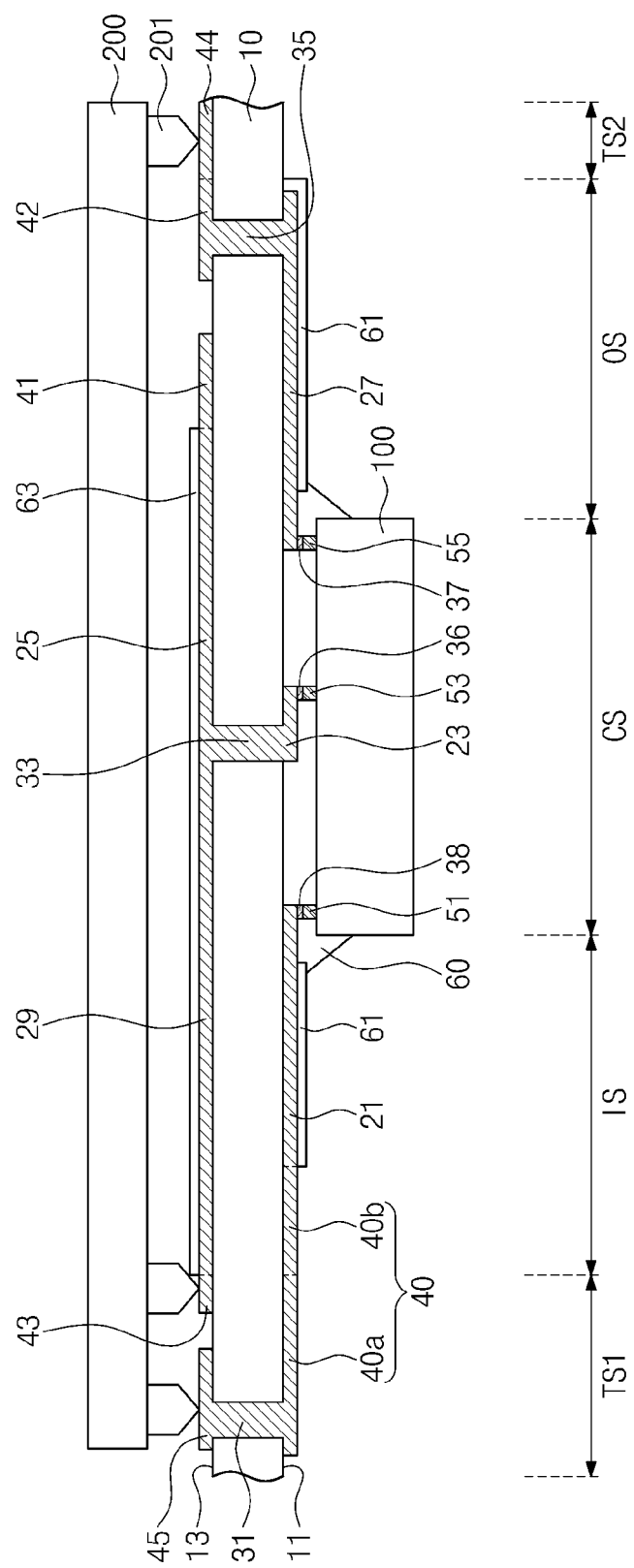
FIG. 1 is a cross-sectional view illustrating a semiconductor package before a cutting process according to example embodiments of the inventive concepts.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, example embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being on another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the example embodiment in the detailed description will be described with sectional views as ideal exemplary views of the inventive concepts. Accordingly, shapes of the exemplary views may be modified according to manufacturing techniques and/or allowable errors. Therefore, the example embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present inventive concepts. Embodiments of aspects of the present inventive concepts explained and illustrated herein include their complementary counterparts. The same reference numerals or the same reference designators denote the same elements throughout the specification.

Figure 2A:
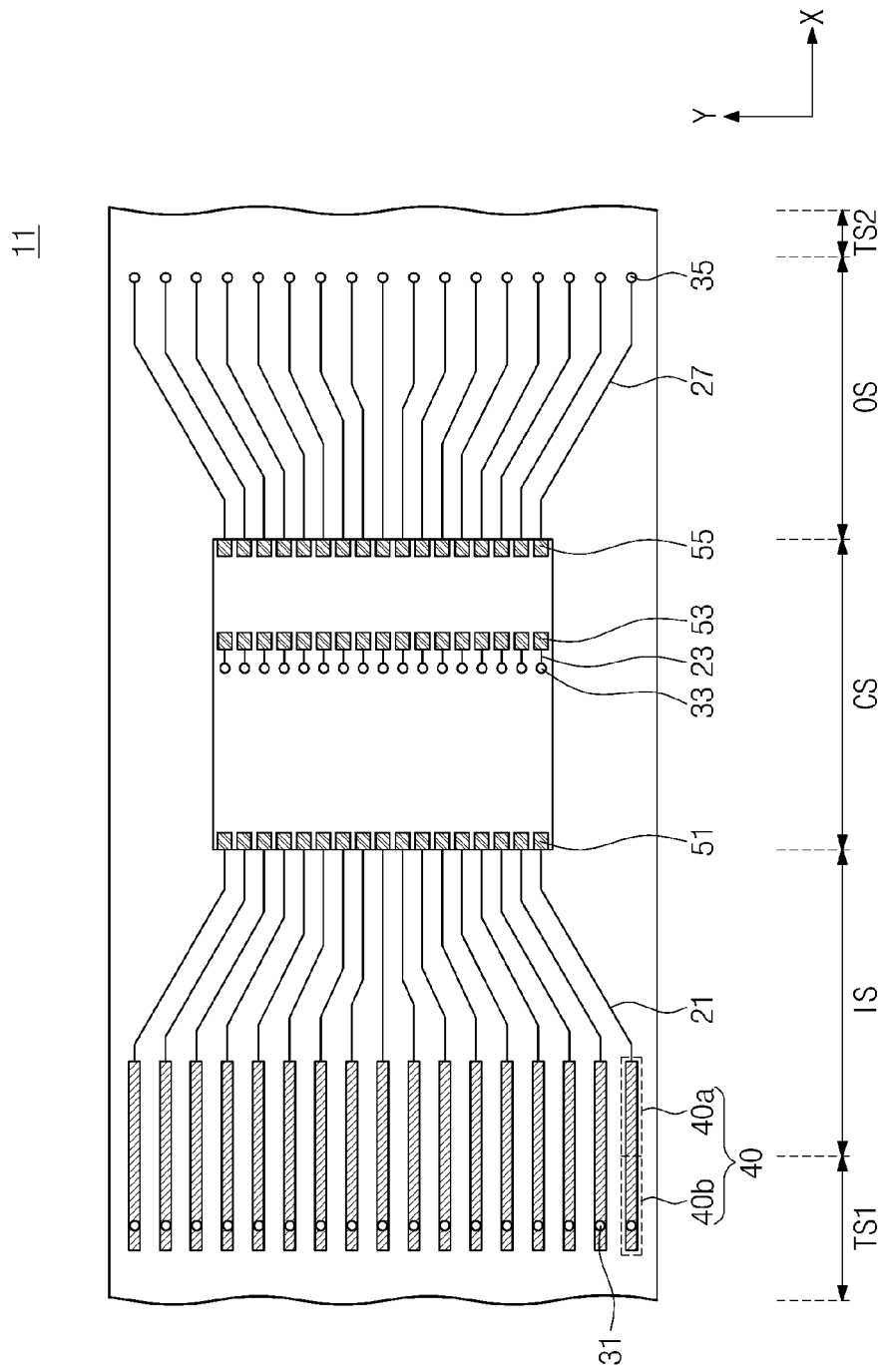
FIG. 2A is a bottom view of the semiconductor package of FIG. 1 according to example embodiments of the inventive concepts.
Figure 2B:
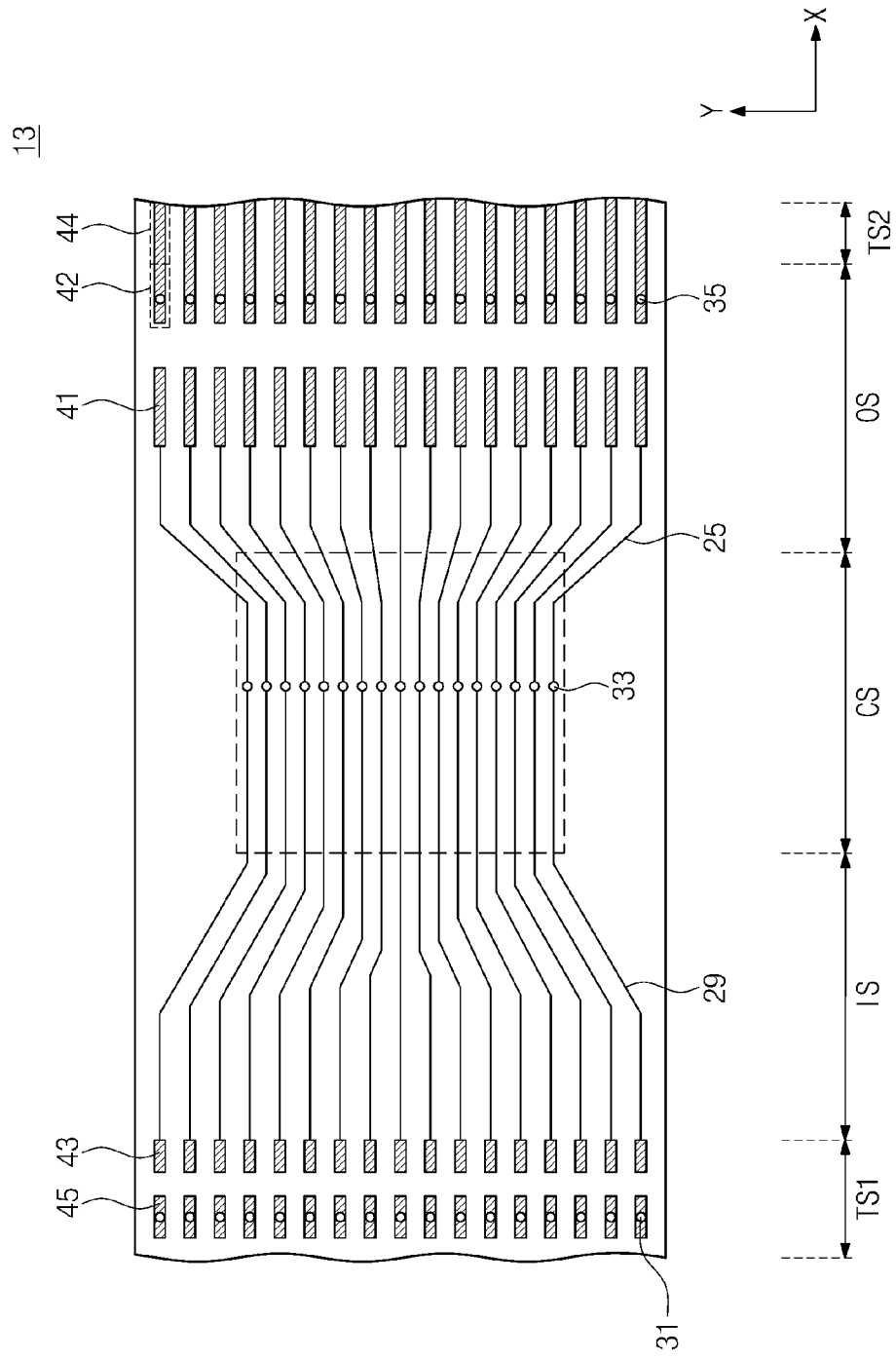
FIG. 2B is a top view of the semiconductor package of FIG. 1 according to example embodiments of the inventive concepts.
Figure 3:
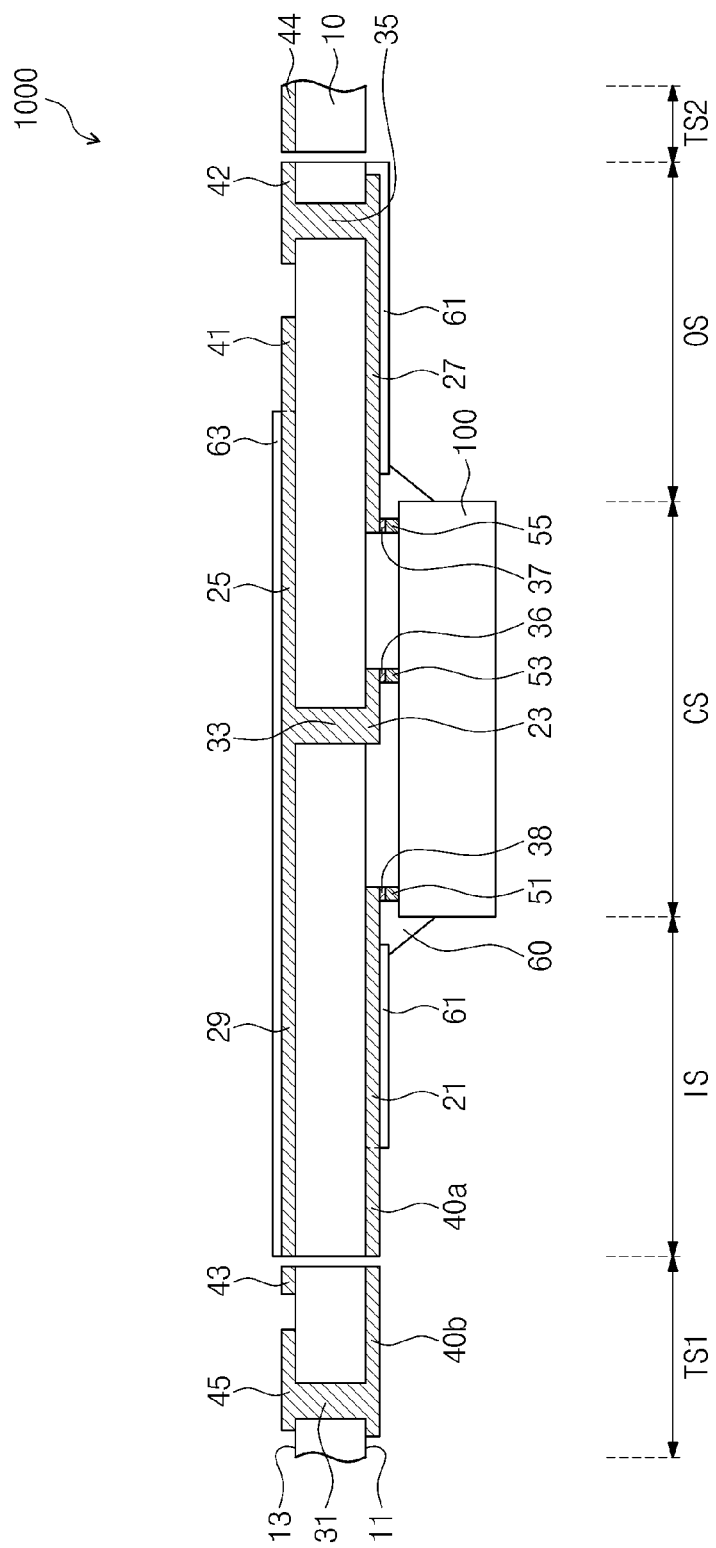
FIG. 3 is a cross-sectional view illustrating a semiconductor package after the cutting process according to example embodiments of the inventive concepts.

FIG. 1 is a cross-sectional view illustrating a semiconductor package before a cutting process according to example embodiments of the inventive concepts. FIG. 2A is a bottom view of the semiconductor package of FIG. 1 according to example embodiments of the inventive concepts. FIG. 2B is a top view of the semiconductor package of FIG. 1 according to example embodiments of the inventive concepts. FIG. 3 is a cross-sectional view illustrating a semiconductor package after the cutting process according to example embodiments of the inventive concepts.

Referring to FIGS. 1, 2A, and 2B, a semiconductor chip 100 may be disposed on an insulating film 10. The insulating film 10 may be a package substrate. The insulating film 10 may be a flexible film including a polyimide or an epoxy-based resin. The insulating film 10 may include a first surface 11 and a second surface 13. The first surface 11 may correspond to a bottom surface of the insulating film 10, and the second surface 13 may correspond to a top surface of the insulating film 10. The insulating film 10 may include a chip region CS, an input region IS, an output region OS, a first test region TS1, and a second test region TS2. In detail, the chip region CS may be a central region of the insulating film 10. The input region IS may be disposed at one side of the chip region CS, and the output region OS may be disposed at another side of the chip region CS. The first test region TS1 may be disposed at a side of the input region IS, and the second test region TS2 may be disposed at a side of the output region OS. In more detail, the input region IS may be disposed between the first test region TS1 and the chip region CS, and the output region OS may be disposed between the second test region TS2 and the chip region CS. In some embodiments, the chip region CS, the input region IS, and the output region OS may mean a substantial chip region. In other words, the package substrate region CS, the input region IS, and the output region OS may constitute the substantial package substrate region.

Input pads 40 may be disposed on the first surface 11 of the insulating film 10. The input pads 40 may extend in a first direction X parallel to the first surface 11 of the insulating film 10 so as to be disposed on both the insulating film 10 of the input region IS and the insulating film 10 of the first test region TS1. The input pads 40 may be arranged in a second direction Y crossing the first direction X. Each of the input pads 40 may include a first input pad 40a and a second input pad 40b. The first input pads 40a may be disposed in the input region IS, and the second input pads 40b may be disposed in the first test region TS1.

Vias 31, 33 and 35 may penetrate the insulating film 10. In example embodiments, input vias 31 may be disposed in the first test region TS1 of the insulating film 10. First output vias 33 may be disposed in the chip region CS of the insulating film 10, and second output vias 35 may be disposed in the output region OS of the insulating film 10. The input vias 31 may be disposed to correspond to the input pads 40, respectively. The input vias 31 may be connected to the input pads 40 in one-to-one correspondence. The input pads 31 may be arranged in the second direction Y. The first output vias 33 may be arranged in the second direction Y in the chip region CS. The second output vias 35 may be disposed to respectively correspond to second output pads 42 disposed on the second surface 13 of the insulating film 10. The second output vias 35 may be connected to the second output pads 42 in one-to-one correspondence. The second output vias 35 may be arranged in the second direction Y.

Input leads 21, first output lower leads 23, and second output leads 27 may be disposed on the first surface 11 of the insulating film 10. The input leads 21 may be disposed in the input region IS of the insulating film 10. The input leads 21 may extend in the first direction X so as to be connected to the input pads 40 in one-to-one correspondence. The first output lower leads 23 may be disposed in the chip region CS of the insulating film 10. The first output lower leads 23 may extend in the first direction X so as to be connected to the first output vias 33 in one-to-one correspondence. The second output leads 27 may be disposed in the output region OS of the insulating film 10. The second output leads 27 may extend in the first direction X so as to be connected to the second output vias 35 in one-to-one correspondence.

In the chip region CS, first pads 36, second pads 37, and third pads 38 may be disposed on the first surface 11 of the insulating film 10. The first pads 36 may be connected to the first output lower leads 23, respectively. The second pads 37 may be connected to the second output leads 27, respectively, and the third pads 38 may be connected to the input leads 21, respectively. The first pads 36 may be disposed between the second pads 37 and the third pads 38. The second pads 37 may be adjacent to the output region OS of the insulating film 10, and the third pads 38 may be adjacent to the input region IS of the insulating film 10. The first output vias 33 may be disposed between the second pads 37 and the third pads 38 when viewed from a plan view.

The semiconductor chip 100 may be disposed on the first surface 11 of the insulating film 10 in the chip region CS. The semiconductor chip 100 may be a display driver integrated circuit (DDI). The DDI may be a semiconductor device that controls pixels of a display panel to adjust colors of an image. One surface of the semiconductor chip 100 may be adjacent to the first surface 11 of the insulating film 10. Input bumps 51, first output bumps 53, and second output bumps 55 may be disposed on the one surface of the semiconductor chip 100.

The input bumps 51 may be disposed to be adjacent to the input region IS, and the second output bumps 55 may be disposed to be adjacent to the output region OS. The first output bumps 53 may be disposed between the input bumps 51 and the second output bumps 55. The input bumps 51 may be arranged in the second direction Y and may be connected to the input leads 21 in one-to-one correspondence. The input bumps 51 may be in contact with the third pads 38. The first output bumps 53 may be arranged in the second direction Y and may be connected to the first output lower leads 23 in one-to-one correspondence. The first output bumps 53 may be in contact with the first pads 36.

The second output bumps 55 may be arranged in the second direction Y and may be connected to the second output leads 27 in one-to-one correspondence. The second output bumps 55 may be in contact with the second pads 37.

As a result, the input leads 21 may be connected between the input pads 40 and the input bumps 51, and the first output lower leads 23 may be connected between the first output vias 33 and the first output bumps 53. The second output leads 27 may be connected between the second output vias 35 and the second output bumps 55.

First output pads 41, second output pads 42, first output test pads 43, second output test pads 44, and input test pads 45 may be disposed on the second surface 13 of the insulating film 10. The first and second output pads 41 and 42 may be disposed in the output region OS of the insulating film 10. The first output pads 41 may be arranged in the second direction Y, and the second output pads 42 may also be arranged in the second direction Y. The first output pads 41 may be spaced apart from the second output pads 42. The first output pads 41 may be disposed between the chip region CS and the second output pads 42.

The first output test pads 43 and the input test pads 45 may be disposed in the first test region TS1 of the insulating film 10. The first output test pads 43 may be arranged in the second direction Y, and the input test pads 45 may be arranged in the second direction Y. The first output test pads 43 may be spaced apart from the input test pads 45. The first output test pads 43 may be disposed between the input test pads 45 and the input region IS. In other words, the first output test pads 43 may be adjacent to the input region IS, and the input test pads 45 may be spaced apart from the input region IS with the first output test pads 43 interposed therebetween.

The second output test pads 44 may be disposed in the second test region TS2 of the insulating film 10 and may be arranged in the second direction Y. Each of the second output test pads 44 may be in contact with a corresponding one of the second output pads 42. The second output test pad 44 and the second output pad 42 which are in contact with each other may extend in the first direction X.

The input vias 31 may be disposed to respectively correspond to the input test pads 45 and may be connected to the input test pads 45 in one-to-one correspondence. Thus, the input bumps 51 may be electrically connected to the input test pads 45 through the input leads 21, the input pads 40 and the input vias 31, respectively.

Each of first output upper lead 25 and each of transmission lead 29 may be connected to a corresponding one of the first output vias 33. The first output upper leads 25 may also be connected to the first output pads 41, respectively. The transmission leads 29 may also be connected to the first output test pads 43, respectively. Thus, the first output bumps 53 may be electrically connected to the first output pads 41 through the first output lower leads 23, the first output vias 33 and the first output upper leads 25, respectively. In addition, the first output bumps 53 may also be electrically connected to the first output test pads 43 through the first output lower leads 23, the first output vias 33 and the transmission leads 29, respectively.

The second output vias 35 may be disposed to respectively correspond to the second output pads 42 and may be connected to the second output pads 42 in one-to-one correspondence. Thus, the second output bumps 55 may be electrically connected to the second output pads 42 through the second output leads 27 and the second output vias 35, respectively.

An underfill resin layer 60 may be provided between the semiconductor chip 100 and the insulating film 10, so the input bumps 51, the first output bumps 53, and the second output bumps 55 may be covered with the underfill resin layer 60. A first resist layer 61 may be disposed on the first surface 11 of the insulating film 10 to cover the input leads 21 and the second output leads 27. A second resist layer 63 may be disposed on the second surface 13 of the insulating film 10 to cover the first output upper leads 25 and the transmission leads 29.

A measurement device 200 may be provided on the second surface 13 of the insulating film 10 to test electrical characteristics of the semiconductor chip 100. The measurement device 200 may include probe parts 201. The probe parts 201 may come in contact with the first output test pads 43, the second output test pads 44, and the input test pads 45 which are disposed on the second surface 13 of the insulating film 10. A cutting process of separating chip-on-film (COF) packages from each other may be performed on the insulating film 10 after the test of the electrical characteristics. The first test region TS1 and the second test region TS2 of the insulating film 10 may be separated from the input region IS and the output region OS of the insulating film 10 by the cutting process. As a result, a semiconductor package 1000 may be formed as illustrated in FIG. 3.

According to example embodiments of the inventive concepts, the first output test pads 43, the second output test pads 44, and the input test pads 45 may be disposed on the same surface of the insulating film 10. Thus, it is possible to measure or test signal transmission characteristics and/or electrical characteristics of input and output circuits connected to the first and second output test pads 43 and 44 and the input test pads 45 at once.

Figure 4:
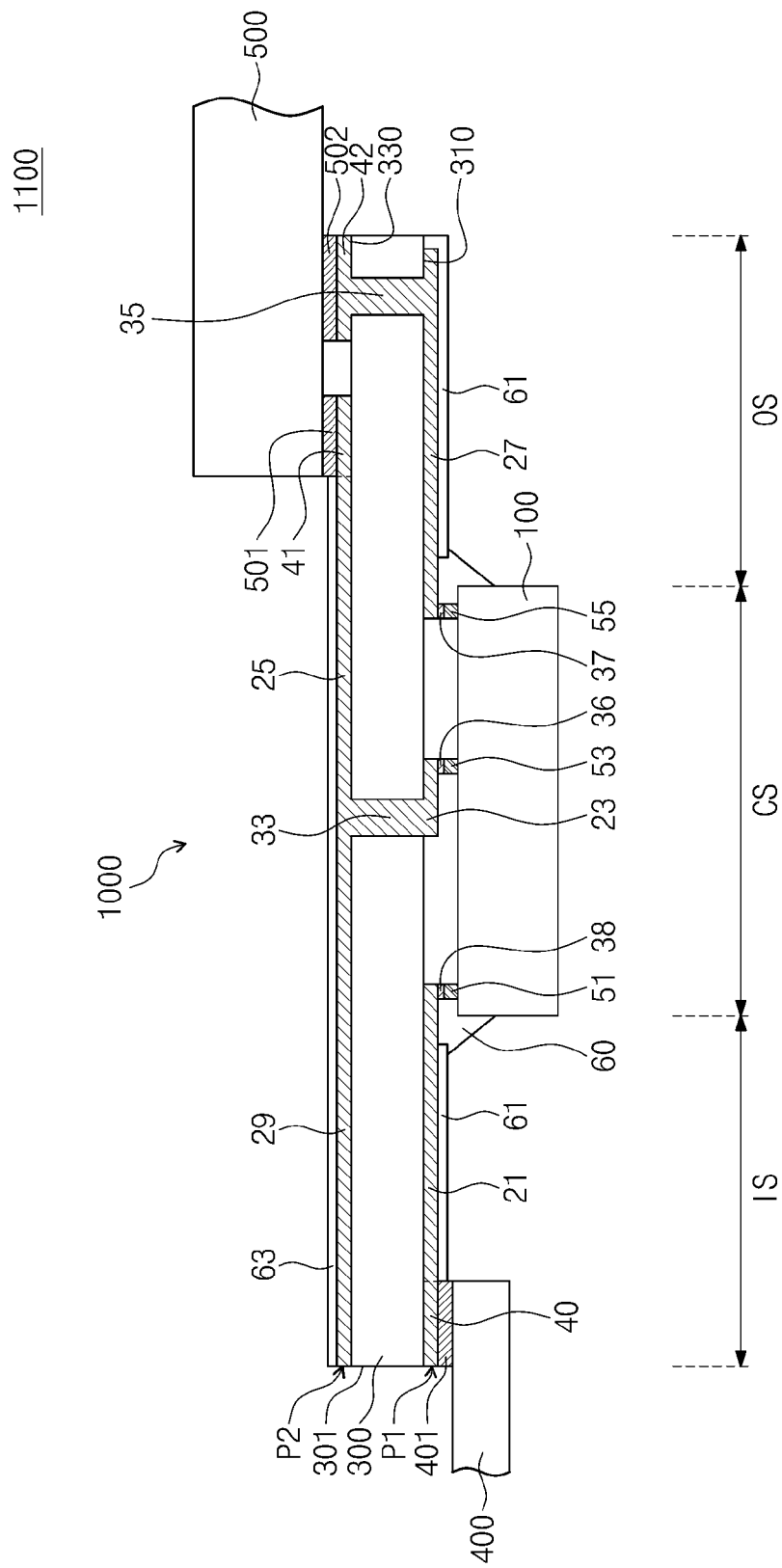
FIG. 4 is a cross-sectional view illustrating a display device including a semiconductor package according to example embodiments of the inventive concepts.
Figure 5:
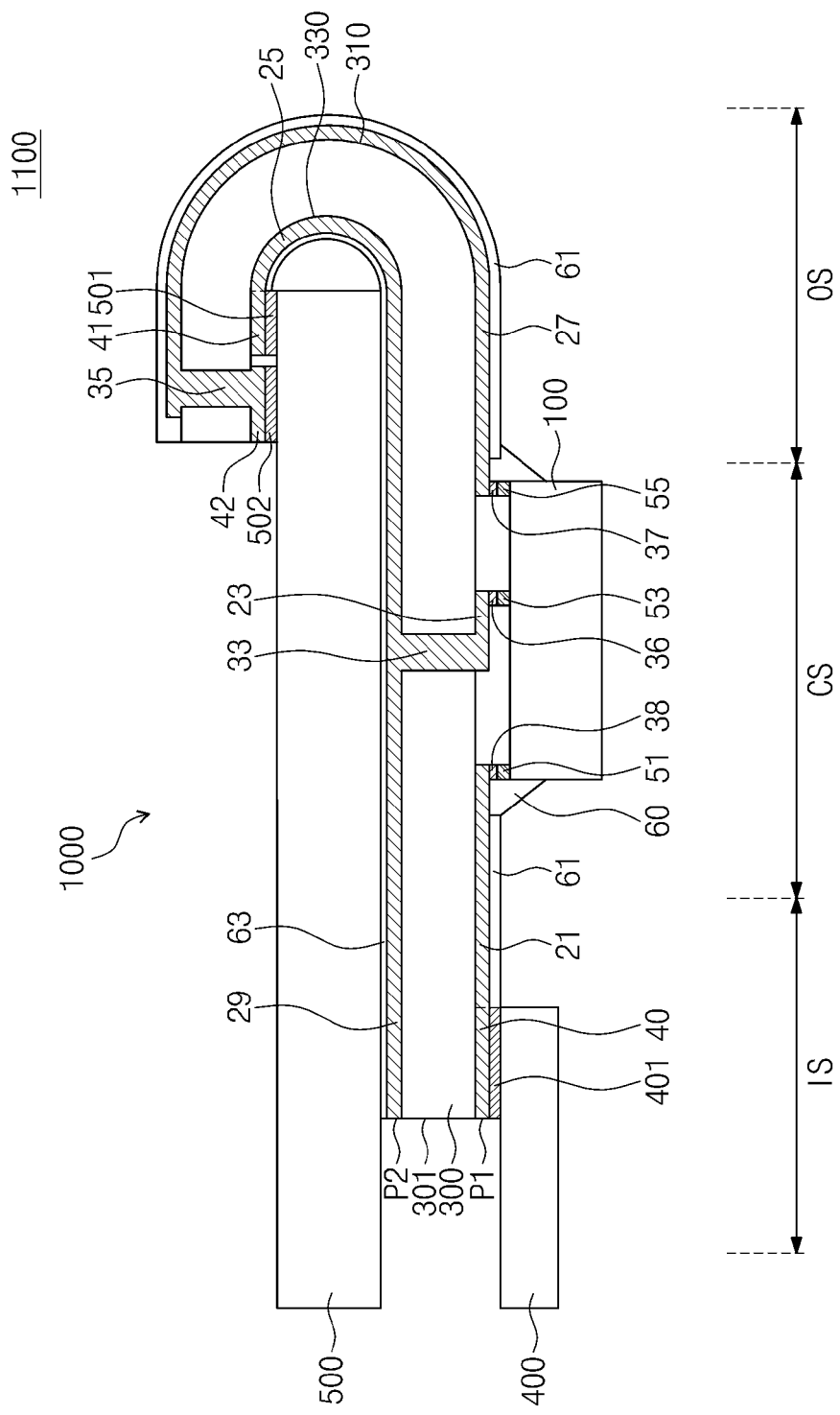
FIG. 5 is a cross-sectional view illustrating a display device including a bent semiconductor package according to example embodiments of the inventive concepts.
Figure 6B:
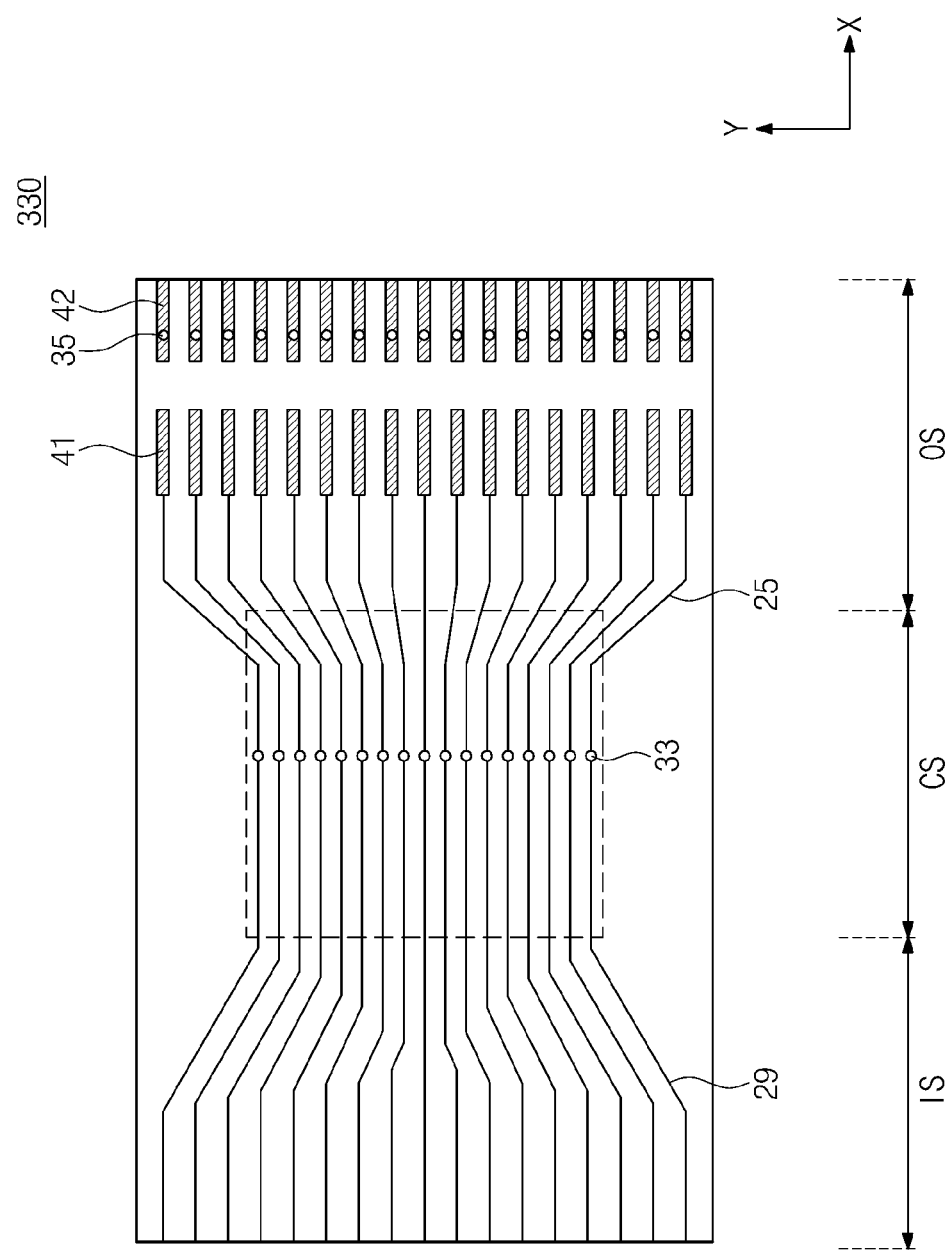
FIG. 6B is a top view of the display device of FIGS. 4 and 5 according to example embodiments of the inventive concepts.

FIG. 4 is a cross-sectional view illustrating a display device including a semiconductor package according to example embodiments of the inventive concepts. FIG. 5 is a cross-sectional view illustrating a display device including a bent semiconductor package according to example embodiments of the inventive concepts. FIG. 6A is a bottom view of the display device of FIGS. 4 and 5 according to example embodiments of the inventive concepts. FIG. 6B is a top view of the display device of FIGS. 4 and 5 according to example embodiments of the inventive concepts.

Referring to FIGS. 4, 5, 6A, and 6B, a display device 1100 may include a semiconductor package 1000, a circuit substrate 400, and a panel 500. The semiconductor package 1000 may include a package substrate 300 and a semiconductor chip 100. The semiconductor chip 100 may be disposed on the package substrate 300. The package substrate 300 may include a first surface 310 and a second surface 330. In addition, the package substrate 300 may include a chip region CS, an input region IS, and an output region OS. The chip region CS may correspond to a central region of the package substrate 300. The input region IS may be disposed at one side of the chip region CS, and the output region OS may be disposed at another side of the chip region CS.

Input pads 40 may be disposed on the first surface 310 of the package substrate 300. The input pads 40 may extend in a first direction X parallel to the first surface 310 of the package substrate 300 and may be disposed in the input region IS of the package substrate 300. The input pads 40 may be arranged in a second direction Y crossing the first direction X. One sidewall P1 of each of the input pads 40 may be aligned with one sidewall 301 of the package substrate 300.

Output vias 33 and 35 may penetrate the package substrate 300. In detail, first output vias 33 may be disposed in the chip region CS of the package substrate 300 and may be arranged in the second direction Y. Second output vias 35 may be disposed in the output region OS of the package substrate 300. The second output vias 35 may be disposed to respectively correspond to second output pads 42 disposed on the second surface 330 of the package substrate 300 and may be connected to the second output pads 42 in one-to-one correspondence. The second output vias 35 may be arranged in the second direction Y.

Input leads 21, first output lower leads 23, and second output leads 27 may be disposed on the first surface 310 of the package substrate 300. The input leads 21 may be disposed in the input region IS of the package substrate 300. The input leads 21 may extend in the first direction X so as to be connected to the input pads 40, respectively. The first output lower leads 23 may be disposed in the chip region CS of the package substrate 300. The first output lower leads 23 may extend in the first direction X so as to be connected to the first output vias 33, respectively. The second output leads 27 may be disposed in the output region OS of the package substrate 300. The second output leads 27 may extend in the first direction X so as to be connected to the second output vias 35, respectively.

In the chip region CS, first pads 36, second pads 37, and third pads 38 may be disposed on the first surface 310 of the package substrate 300. The first pads 36 may be connected to the first output lower leads 23, respectively. The second pads 37 may be connected to the second output leads 27, respectively, and the third pads 38 may be connected to the input leads 21, respectively. The first pads 36 may be disposed between the second pads 37 and the third pads 38. The second pads 37 may be adjacent to the output region OS of the package substrate 300, and the third pads 38 may be adjacent to the input region IS of the package substrate 300. The first output vias 33 may be disposed between the second pads 37 and the third pads 38 when viewed from a plan view.

The semiconductor chip 100 may be disposed on the package substrate 300 of the chip region CS to cover a portion of the first surface 310. The semiconductor chip 100 may be a display driver integrated circuit (DDI). The DDI may be a semiconductor device that controls pixels of a display panel to adjust colors of an image. Input bumps 51, first output bumps 53, and second output bumps 55 may be disposed on one surface of the semiconductor chip 100 which is adjacent to the first surface 310 of the package substrate 300. In other words, the input bumps 51, the first output bumps 53, and the second output bumps 55 may be disposed between the package substrate 300 and the one surface of the semiconductor chip 100. The input bumps 51 may be adjacent to the input region IS and may be arranged in the second direction Y. The input bumps 51 may be connected to the input leads 21, respectively. The input bumps 51 may be in contact with the third pads 38.

The first output bumps 53 may be disposed between the input bumps 51 and the second output bumps 55. The first output bumps 53 may be arranged in the second direction Y and may be connected to the first output lower leads 23 in one-to-one correspondence. The first output bumps 53 may be in contact with the first pads 36.

The second output bumps 55 may be adjacent to the output region OS. The second output bumps 55 may be arranged in the second direction Y and may be connected to the second output leads 27 in one-to-one correspondence. The second output bumps 55 may be in contact with the second pads 37.

First output pads 41 and second output pads 42 may be disposed on the second surface 330 of the package substrate 300. The first output pads 41 may be disposed in the output region OS of the package substrate 300 and may be arranged in the second direction Y. The second output pads 42 may be disposed in the output region OS of the package substrate 300 and may be arranged in the second direction Y. The second output pads 42 may be spaced apart from the first output pads 41. The first output pads 41 may face the second output pads 42 in the first direction X. In other words, each of the first and second output pads 41 and 42 may constitute a row parallel to the second direction X. The first output pads 41 may be disposed between the chip region CS and the second output pads 42. In other words, the first output pads 41 may be relatively near to the chip region CS, and the second output pads 42 may be spaced apart from the chip region CS with the first output pads 41 interposed therebetween. The row number of the output pads 41 and 42 arranged in the first direction X is two in FIG. 6B. However, the inventive concepts are not limited thereto. In other embodiments, the row number of the output pads arranged in the first direction X may be three or more.

A first output upper lead 25 and a transmission lead 29 may be simultaneously connected to each of the first output vias 33. The first output upper lead 25 may extend in one direction so as to also be connected to each of the first output pads 41. The transmission lead 29 may extend in a direction opposite to the extending direction of the first output upper lead 25. Thus, an end P2 of each of the transmission leads 29 may be exposed at the one sidewall 301 of the package substrate 300. The first output bumps 53 may be electrically connected to the first output pads 41 through the first output lower leads 23, the first output vias 33 and the first output upper leads 25, respectively.

The second output vias 35 may be disposed to respectively correspond to the second output pads 42 and may be connected to the second output pads 42 in one-to-one correspondence. Thus, the second output bumps 55 may be electrically connected to the second output pads 42 through the second output leads 27 and the second output vias 35, respectively.

In some example embodiments, a plurality of the output pads may be disposed on the first surface 310 of the package substrate 300. The output pads may be connected to the bumps and the vias, respectively. Thus, the panel 500 may receive a lot of output signals from the semiconductor chip 100.

An underfill resin layer 60 may be provided between the semiconductor chip 100 and the package substrate 300, so the input bumps 51, the first output bumps 53, and the second output bumps 55 may be covered with the underfill resin layer 60. A first resist layer 61 may be disposed on the first surface 310 of the package substrate 300 to cover the input leads 21 and the second output leads 27. The input pads 40 may be exposed by the first resist layer 61. A second resist layer 63 may be disposed on the second surface 330 of the package substrate 300 to cover the first output upper leads 25 and the transmission leads 29.

The circuit substrate 400 may be disposed on the input pads 40. The input pads 40 may be in electrical contact with a substrate pad 401 of the circuit substrate 400. The panel 500 may be disposed on the first output pads 41 and the second output pads 42.

The first and second output pads 41 and 42 may be in electrical contact with first and second panel pads 501 and 502 of the panel 500, respectively.

In a final structure of the display device 1100, a portion of the package substrate 300 may be bent as illustrated in FIG. 5. For example, the package substrate 300 of the output region OS may be bent. Thus, the portion of the second surface 330 of the package substrate 300 on which the first and second output pads 41 and 42 are disposed may be opposite to another portion of the second surface 330 of the package substrate 300. In addition, one surface of the panel 500 may be in contact with the second resist layer 63 but another surface of the panel 500 may display an image.

Figure 7:
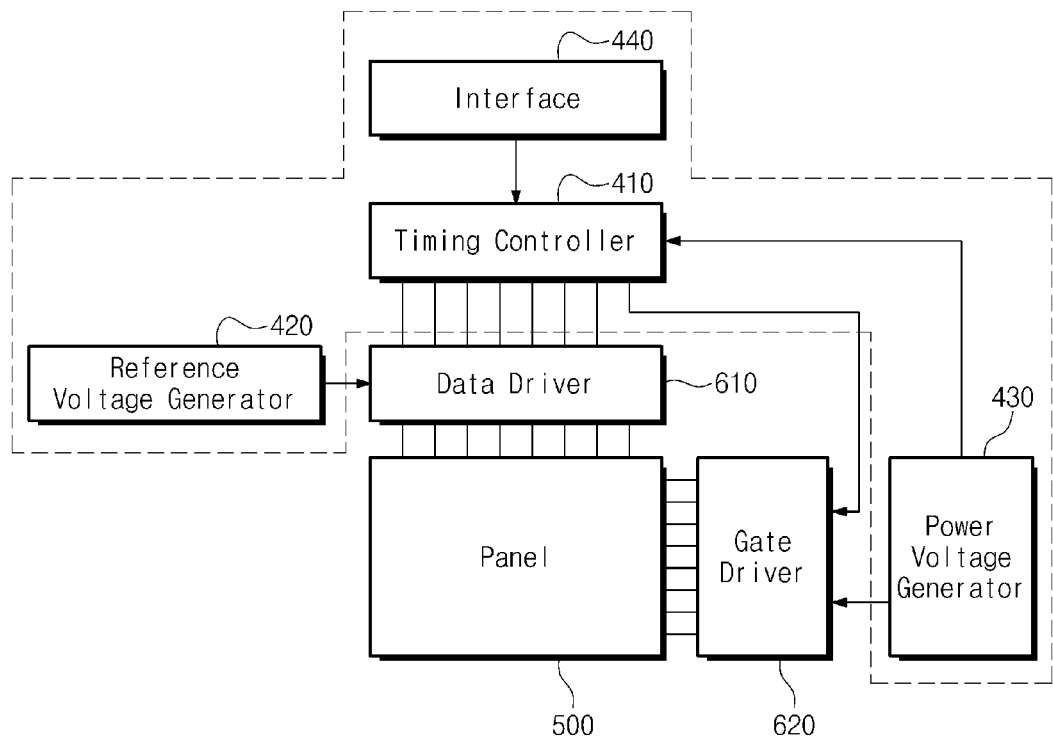
FIG. 7 is a schematic block diagram illustrating a display device according to example embodiments of the inventive concepts.

FIG. 7 is a schematic block diagram illustrating a display device according to example embodiments of the inventive concepts. Referring to FIGS. 4, 5, 6A, 6B, and 7, the semiconductor chip 100 may correspond to a data driver 610 and/or a gate driver 620 of the display device 1100. The data driver 610 may process data signals transmitted from a timing controller 410. In addition, the data driver 610 may process scan signals transmitted from the timing controller 410.

The timing controller 410, a reference voltage generator 420, a power voltage generator 430, and an interface unit 440 may be mounted on the circuit board 400. The timing controller 410 may generate the data signals, the scan signals, and control signals. The reference voltage generator 420 may generate a reference voltage used to generate color signals or image signals corresponding to the data signals in the data driver 610. The data signals may be temporarily stored or latched in the data driver 610 by control signals. Thereafter, the color signals or the image signals may synchronize with the scan signal transmitted from the gate driver 620 so as to be transmitted to data lines of the panel 500. The gate driver 620 may sequentially transmit the scan signals to the gate lines of the panel 500. The power voltage generator 530 may generate a power voltage of the timing controller 410 and the gate driver 620. The power voltage may be different from the reference voltage.

The semiconductor package 1000 may electrically connect the circuit substrate 400 to the panel 500.

FIGS. 8 to 11 illustrate embodiments of multimedia devices equipped with a display device according to example embodiments of the inventive concepts.

Figure 8:
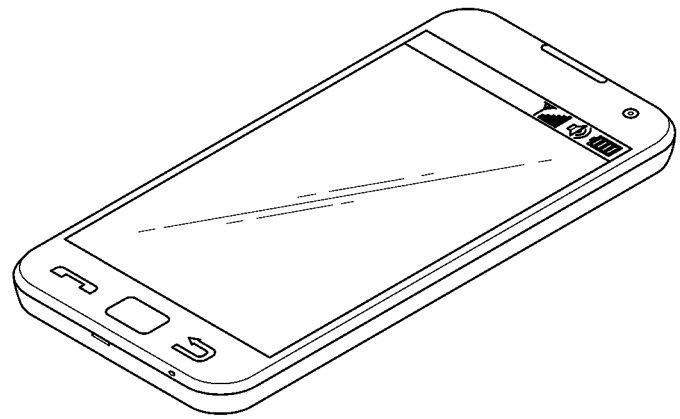
FIGS. 8 to 11 illustrate embodiments of multimedia devices equipped with a display device according to example embodiments of the inventive concepts.
Figure 9:
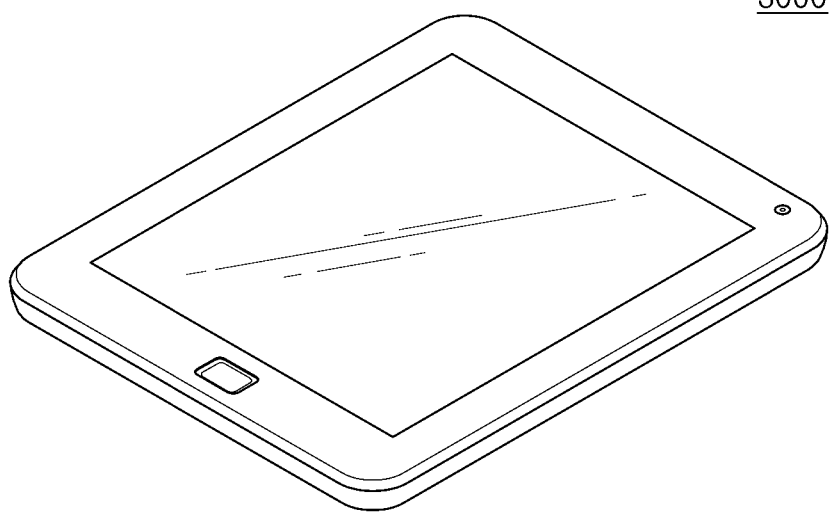
Figure 10:
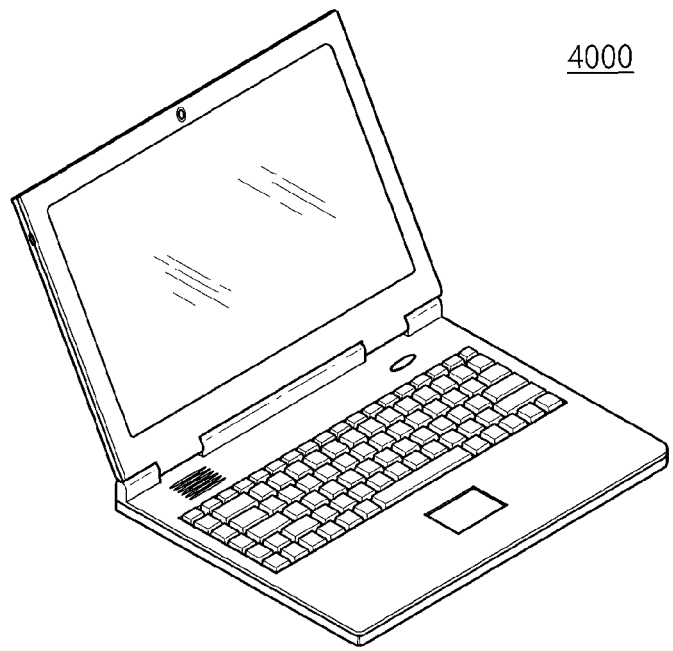
Figure 11:
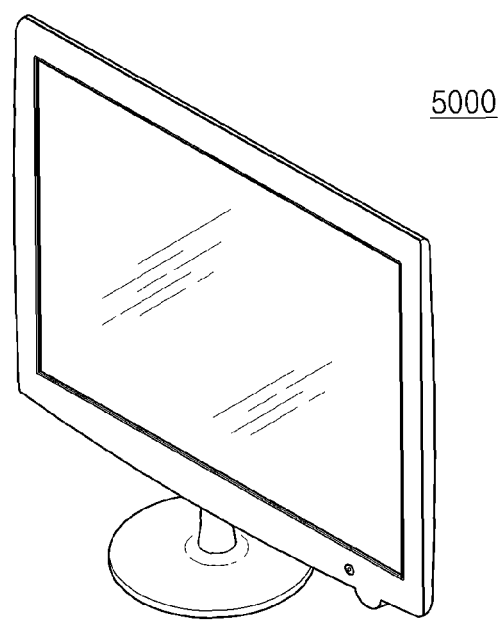

The display device 1100 according to the above embodiments of the inventive concepts may be applied to a mobile or smart phone 2000 illustrated in FIG. 8 and/or a tablet or smart tablet 3000 illustrated in FIG. 9. In addition, the display device 1100 according to the above embodiments of the inventive concepts may be applied to a notebook computer 4000 illustrated in FIG. 10 and/or a television, monitor or smart television 5000 illustrated in FIG. 11.

The semiconductor package according to example embodiments of the inventive concepts may include the input test pad, the first output test pad, and the second output test pad which are disposed on the same surface of the insulating film or the package substrate. Since the input test pad and the plurality of output test pads are disposed on the same surface, the characteristic test of the semiconductor chip may be performed at once. In other words, a test time of the semiconductor chip may be reduced.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor package comprising:
   a first output test pad and a second output test pad disposed on a first surface of an insulating film;
   a semiconductor chip disposed between the first output test pad and the second output test pad on a second surface opposing to the first surface of the insulating film;
   a first output pad disposed adjacent to the second output test pad on the first surface of the insulating film, and connected with the first output test pad; and
   a second output pad disposed between the first output pad and the second output test pad on the first surface of the insulating film, and contacts with the second output test pad.

2. The semiconductor package of claim 1, further comprising:
   a first output via and a second output via penetrating the insulating film and disposed between the first and second output test pads; and
   a first pad and a second pad disposed between the second surface of the insulating film and the semiconductor chip,
   wherein the first output via electrically connects the first output test pad and the first pad with each other, and
   wherein the second output via electrically connects the second output test pad and the second pad with each other.

3. The semiconductor package of claim 2, further comprising a second output lead disposed on the second surface of the insulating film, and connecting the second output via and the second pad with each other.

4. The semiconductor package of claim 1, further comprising:
   a first output lead disposed between the first output test pad and the first output pad on the first surface of the insulating film to establish a connection therebetween.

5. The semiconductor package of claim 2, further comprising:
   an input test pad disposed beside the first output test pad to be adjacent to an edge portion of the insulating film on the first surface of the insulating film;
   an input pad disposed between the first output test pad and the semiconductor chip on the second surface of the insulating film;
   an input via penetrating the insulating film to connect the input test pad and the input pad with each other, and disposed between the first output test pad and the input test pad; and
   a third pad disposed between the second surface of the insulating film and the semiconductor chip, and connected with the input pad.

6. The semiconductor package of claim 5, wherein:
   the first pad is disposed between the second pad and the third pad;
   the second pad is disposed adjacent to the second output test pad; and
   the third pad is disposed adjacent to the input test pad.

7. The semiconductor package of claim 5, wherein the input pad is extended toward the input test pad to contact with the input via.

8. A display device comprising:
   a package substrate including a first surface and a second surface opposing to the first surface; and a semiconductor chip disposed on the second surface of the package substrate, wherein the package substrate comprises:
a first output pad disposed on the first surface of the package substrate;
a second output pad disposed between the first output pad and the semiconductor chip on the first surface of the package substrate;
a first output via penetrating the package substrate, and connecting the first output pad and the semiconductor chip with each other;
a second output via penetrating the package substrate, and connecting the second output pad and the semiconductor chip with each other;
an input pad disposed on the second surface of the package substrate; and
a circuit board being in electrical contact with the input pad.

9. The display device of claim 8, further comprising:
a first output lower lead disposed on the second surface of the package substrate, and connects the semiconductor chip and the first output via with each other;
a second output lower lead disposed spaced apart from the first output lower lead on the second surface of the package substrate, and connects the semiconductor chip and the second output via with each other; and
an output upper lead disposed between the second output pad and the second output via on the first surface of the package substrate to establish a connection therebetween.

10. The display of claim 9, wherein:
the output upper lead is extended crossing the second output via, and
one edge portion of the output upper lead is exposed at one sidewall of the package substrate.

11. The display of claim 8, further comprising:
an input lead disposed between the input pad and the semiconductor chip on the second surface of the package substrate to establish a connection therebetween,
wherein the input pad faces the second output pad with the semiconductor chip as the center in the diagonal direction.

12. The display of claim 11, wherein one sidewall of the input pad is coplanar with one sidewall of the package substrate.

13. The display of claim 11, further comprising:
a panel disposed on the first output pad and the second output pad.

14. The display of claim 8, wherein:
the first output via is disposed below the first output pad to contact the first output pad, and
the second output via is disposed below the semiconductor chip.

15. The display of claim 8, wherein one sidewall of the first output pad is coplanar with one sidewall of the package substrate.

16. A film for a package substrate comprising:
a first test pad, a second test pad and a third test pad disposed on one surface of insulating film, the third test pad is disposed between the first test pad and the second test pad and is adjacent to the first test pad;
a first in/output pad and a second in/output pad disposed between the second test pad and the third test pad on the one surface of the insulating film, the first in/output pad is connected with the second test pad, and the second in/output pad is connected with the third test pad;
a third in/output pad disposed between the third test pad and the second in/output pad on other surface opposing to the one surface of the insulating film, and connected with the first test pad through a first via penetrating the insulating film; and
a chip pad disposed between the second in/output pad and the third in/output pad on the other surface of the insulating film.

17. The film for the package substrate of claim 16, wherein the first in/output pad contacts with the second test pad.

18. The film for the package substrate of claim 16, wherein the second in/output pad is disposed more adjacent to the first in/output pad than the third test pad.

19. The film for the package substrate of claim 16, further comprising:
a second via penetrating the insulating film, and connected with the first in/output pad; and
a third via penetrating the insulating film to be connected with second in/output pad, and disposed between the first via and the second via.

20. The film for the package substrate of claim 16, wherein the third in/output pad is extended toward the first test pad to contact with the first via.

* * * * *